United States Patent
Jang et al.

[11] Patent Number: 6,114,253
[45] Date of Patent: Sep. 5, 2000

[54] VIA PATTERNING FOR POLY(ARYLENE ETHER) USED AS AN INTER-METAL DIELECTRIC

[75] Inventors: Syun-Ming Jang; Ming-Hsin Huang; Chen-Hua Yu, all of Hsin-Chu, Taiwan

[73] Assignee: Taiwan Semiconductor Manufacturing Company, Hsin-Chu, Taiwan

[21] Appl. No.: 09/268,542

[22] Filed: Mar. 15, 1999

[51] Int. Cl.[7] .................................................. H01L 21/302
[52] U.S. Cl. ............................ 438/725; 438/743; 216/49
[58] Field of Search .................................... 438/706, 712, 438/714, 717, 723, 725, 743, 623, 637, 690, 691, 692; 216/49

[56] References Cited

U.S. PATENT DOCUMENTS

| | | | |
|---|---|---|---|
| 5,482,894 | 1/1996 | Havemann | 437/195 |
| 5,486,493 | 1/1996 | Jeng | 437/195 |
| 5,514,247 | 5/1996 | Shan et al. | 156/643.1 |
| 5,565,384 | 10/1996 | Havemann | 437/228 |
| 5,591,677 | 1/1997 | Jeng | 437/195 |
| 5,616,959 | 4/1997 | Jeng | 257/758 |
| 6,040,248 | 3/2000 | Chen et al. | 438/725 |

*Primary Examiner*—Benjamin L. Utech
*Assistant Examiner*—Kin-Chan Chen
*Attorney, Agent, or Firm*—George O. Saile; Stephen B. Ackerman

[57] ABSTRACT

A process for removal of residual silicon oxide hardmask used to etch vias in low-k organic polymer dielectric layers is described. The hardmask deteriorates by developing an angular aspect or faceting along the pattern edges when used to etch organic polymer layers in an oxygen/inert gas plasma in a high density plasma etcher. In addition the deterioration of the hardmask during organic polymer etching causes a significant degradation of surface planarity which would result in via-to-via shorts when a second metal layer is patterned over it if the hardmask were left in place. The residual hardmask is selectively removed immediately after the via etch by a soft plasma etch which restores surface planarity and removes via edge facets. The plasma etch has a high selectivity of oxide-to-organic polymer so that the surface irregularities are not transferred to the polymer surface and the exposed metal surface at the base of the via is also unscathed.

11 Claims, 3 Drawing Sheets

VIA PATTERNING FOR POLY(ARYLENE ETHER) USED AS AN INTER-METAL DIELECTRIC

RELATED PATENT APPLICATION

TSMC-98-006, U.S. application Ser. No. 09/149,257, filed Sep. 8, 1998, pending "VIA FORMATION IN A POLY(ARYLENE ETHER) INTER METAL DIELECTRIC LAYER" by S. M. Jang, assigned to a common assignee.

BACKGROUND OF THE INVENTION (1) Field of the Invention

The invention relates to processes for the manufacture of semiconductor devices and more particularly to processes related to formation of vias and contacts in organic insulative layers on semiconductor wafers.

(2) Background of the Invention and Description of Previous Art

Integrated circuits(ICs) are manufactured by first forming discrete semiconductor devices within the surface of silicon wafers. A multi-level metallurgical interconnection network is then formed over the devices contacting their active elements and wiring them together to create the desired circuits. The wiring layers are formed by first depositing an insulating layer over the discrete devices, patterning and etching contact openings into this layer, and then depositing conductive material into these openings. A conductive layer is then applied over the insulating layer which is patterned and etched to form wiring interconnections between the device contacts thereby creating a first level of basic circuitry. These basic circuits are then further interconnected by utilizing additional wiring levels laid out over a additional insulating layers with via pass throughs.

The performance or speed of the integrated circuits is determined in large part by the conductance and capacitance of the metal wiring network. For many years aluminum wiring and silicon oxide inter level dielectric layers have been the norm. As device densities increase and geometries decrease, however, the RC time constraints of the interconnective wiring have become increasingly restrictive to integrated circuit performance. Thus in order to further improve performance, researchers have, in recent years, intensified their search for a metallurgy offering greater conductivity and insulative materials with lower dielectric constants.

Copper is the prominent replacement for aluminum While various organic insulators such as parylene, and arylene ether polymers, have been successfully used as low dielectric constant(low-k) replacements for silicon oxide. Low-k, when applied to insulative layers in integrated circuits, generally refers to a dielectric constant of less than about 3.5 and preferably less than about 2. Porous silica based materials such as siloxanes, aerogels and xerogels have also been implemented as ILD(inter layer dielectric) and IMD (inter-metal dielectric) layers. Fluorinated polyimides offer some improvement in dielectric constant lowering over conventional polyimides.

Many of the low-k dielectric materials, in particular the arylene ether based polymers, for example FLARE™ (Allied Signal Inc.) and Lo-K™2000 (Air Products and Chemicals Inc., Allentown, Pa.) exhibit patterning problems because of their low etch rate selectivities with respect to photoresist. These polymer dielectric layer materials require an oxygen based etchant chemistry for effective patterning to form contact or via openings. Etching is done by RIE (reactive ion etching) or by plasma etching. Typically an $O_2/Ar$ or $O_2/He$ etchant chemistry is used.

In order to cope with the poor etch rate selectivity of these organic low-k materials, a hardmask is used to etch the polymer layer. A layer of silicon oxide, deposited, by PECVD(plasma enhanced chemical vapor deposition) is applied over the cured polymer layer. A silicon dioxide hardmask is formed by patterning the silicon oxide layer. The $SiO_2$ hardmask can then be used to pattern the polymer dielectric layer.

Although the $O_2/Ar$ or $O_2/He$ etchant chemistry is an effective etchant for the polymer layer, problems with respect to the profile of the openings etched in the polymer layer and the etching behavior of the hardmask are encountered. Under the etching conditions which lead to bowed profiles, the hardmask profile remains essentially vertical. However, by varying the etching conditions to reduce the bowing of etched via openings in the polymer, the hardmask begins to exhibit an angular aspect similar to faceting. This is illustrated in the cross section of a wafer 10 in FIG. 1 which shows via openings 16 formed in an organic polymer IMD layer 12 to access metal conductors 18 on insulative layer 20. The metal conductors 18 are typically connected to an underlying structure(not shown) through insulating layer 20. A silicon oxide hardmask 14 has been used to etch the openings 16 with an $O_2/Ar$ plasma in an HDP etcher. The via openings 16 in the polymer layer 12 have essentially vertical sidewalls but the oxide hardmask 14 has developed a severe angular aspect or facet 19.

The angular faceting of the hardmask is caused by argon sputtering within the HDP etching tool. Faceting of the hardmask 14 causes problems in maintaining pattern integrity as well as inadequate metal removal problems during a subsequent tungsten CMP(chemical mechanical polishing) process step. In quarter micron technology, the spacing between the metal lines 18 becomes small and the degradation of the hardmask 14 causes a high incidence of via shorts. The bowing phenomenon and the hardmask faceting phenomenon work against each other. Thus as the polymer profile bowing is reduced the hardmask faceting increases.

It would therefore be advantageous to remove the residual oxide hardmask after the via has been etched in the organic layer. Unfortunately, the aluminum conductive layer now lies exposed at the base of the via opening and is subject to damage and contamination if an aqueous etchant is used to remove the residual hardmask.

Havermann, U.S. Pat. No. 5,565,384 shows a method for placing a low-k organic insulative layer between conductors and forming a self-aligned via through a silicon oxide insulative layer which lies over the conductors and the organic layer. The silicon oxide layer forms the main body of the IMD layer and thereby also forms the main body of the via opening. It is relatively thick compared to the thickness of the organic layer. The organic layer serves to reduce the capacitance between the conductors on the same level but also acts as an etch stop for the silicon oxide via etch. Havermann, U.S. Pat. No. 5,482,894 shows a similar method for forming self-aligned contacts. An inorganic layer over the organic layer acts as a hardmask for etching the contact openings. The residual hardmask is not subsequently removed.

Jeng, U.S. Pat. No. 5,486,493 and Jeng, U.S. Pat. No. 5,591,677 form vias to subjacent metal lines spaced apart by a low-k organic dielectric but the openings are formed entirely within a silicon oxide layer which lies over the organic layer. Shan, U.S. Pat. No. 5,514,247 teaches the etching of vias in a dielectric film such as silicon oxide using fluorocarbon etchants while adding inorganic halogen bearing species to remove metal deposits from the sidewalls of the vias.

SUMMARY OF THE INVENTION

It is an object of this invention to provide a method for the removal of residual hardmask material after the etching of via openings in an organic polymer IMD layer prior to the deposition of conductive material into said via openings.

It is another object of this invention to provide a method for reducing the occurrence of via-to-via shorts for vias formed in organic polymer IMD layers.

It is yet another object of this invention to describe a method of removing residual inorganic hardmask from the surface of an organic layer without causing damage to a conductive layer exposed in openings etched in said organic layer.

These objects are accomplished by soft plasma etching the residual inorganic hardmask in a plasma containing $CF_4$ and/or $SF_6$ after the openings in the organic layer have been formed and the hardmask is no longer needed. An etch rate selectivity of about 6:1 between the inorganic hardmask material and the organic material is obtained. Soft plasma etching as used in the teaching of this invention refers to isotropic plasma etching at pressures of about 10 mTorr.

DESCRIPTION OF THE PREFERRED EMBODIMENTS

Figure 1:
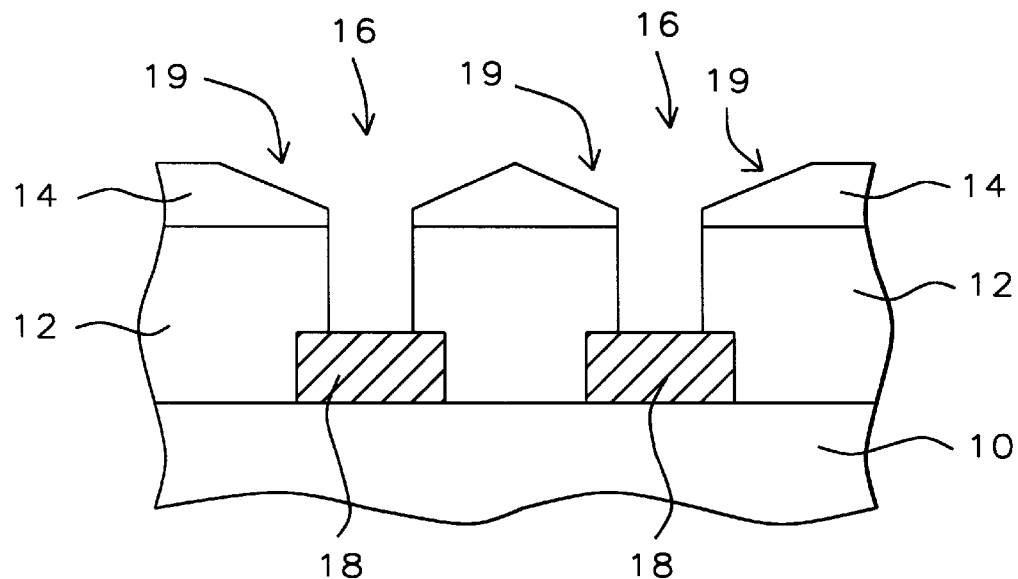
FIG. 1 is a cross section of a silicon wafer showing a hardmask damage hardmask after via openings are etched in an organic polymer layer.
Figure 2A:
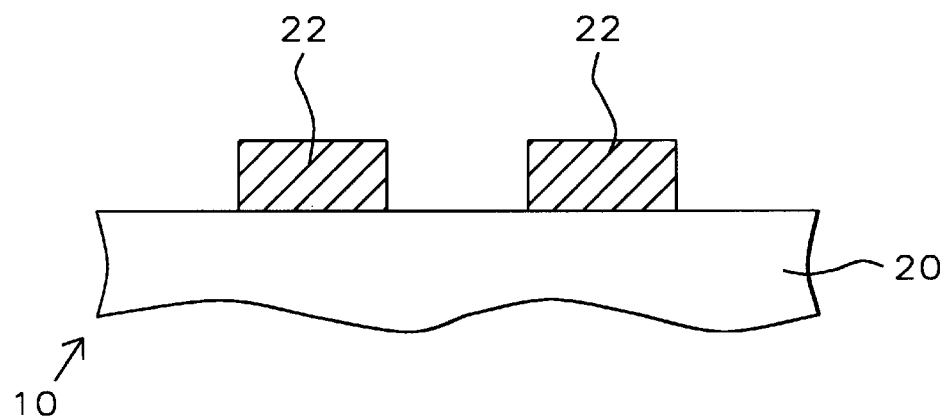
FIGS. 2a, 2b, 2c, 2d, and 2e are cross sections showing the sequence of process steps used to form vias in an organic polymer layer according to an embodiment of this invention.

In a first embodiment of the current invention, a via between two conductive wiring levels is formed. An IMD layer which separates the two conductive wiring levels is formed of a low-k organic dielectric material. Referring to FIG. 2a, a 200 mm. diameter silicon wafer 10 with an insulative layer 20 is provided. Semiconductive devices(not shown) may be formed within the wafer surface by methods well known in the art. A conductive layer 22, preferably of aluminum or an alloy thereof is deposited and patterned over the insulative layer 20 by well known methods for forming conductive metal layers on integrated circuit wafers, to define an interconnection wiring level which forms connections to the semiconductor elements by means of contacts (not shown) in the insulative layer 20.

Figure 2B:
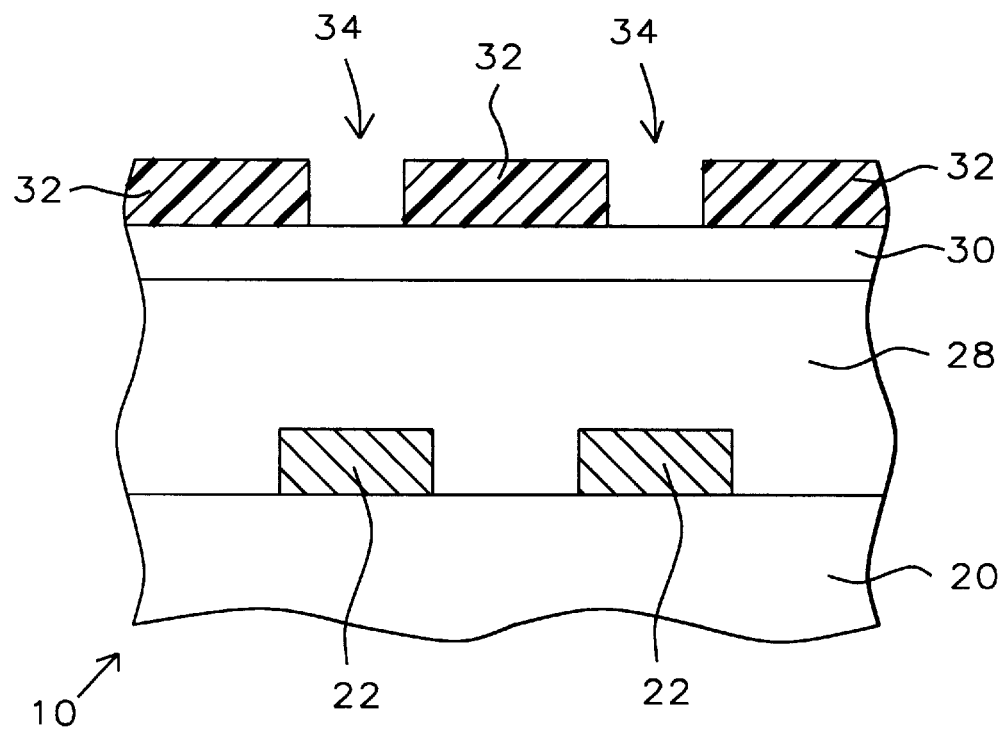

Referring now to FIG. 2b, a low-k organic IMD layer 28, for example an arylene ether polymer is formed over the insulative layer 20 and the patterned conductive layer 22. Precursors for arylene ether polymers such as FLARE or PAE II are commercially available and are suitable for forming the organic IMD layer 28. The IMD layer 28 is formed by first depositing liquid arylene ether monomer onto the wafer from a nozzle as the wafer is spun on a wafer spinner. This method of film deposition is well known and widely practice for a great variety of applications such as the application of photoresists for photolithography and the application of spin-on-glasses for surface planarization. The thickness of the layer 28 is determined by the viscosity of the liquid monomer and the spinning speed of the wafer. After the deposition of the liquid, the film is dried and cured by thermal processing. The curing procedures are generally precursor specific and are well known to those in the art. In the current embodiment the thickness of the fully cured organic polymer layer 28 is preferably between about 0.7 and 0.9 microns thick. A broader thickness range between about 0.5 and 1.2 microns may also be successfully addressed by this invention.

A layer of silicon oxide 30 is next deposited on the cured organic layer 28 by PECVD. Other deposition means may alternately be used to deposit this layer. However, PECVD is preferred because of the low deposition temperature. PECVD silicon oxide may be deposited at temperatures between 200 and 350° C. from $SiH_4/O_2$ or $SiH_4/N_2O$ precursors. The silicon oxide layer is deposited to a thickness of 3,000 Å or thereabout.

The use of spin-on organic polymer layers also has the effect of improving the planarization of the wafer surface, at least at a local level. If further global planarization is required, the wafer may be subjected to a CMP step, either after the organic IMD layer has been cured or after the PECVD silicon oxide layer is deposited. CMP is a procedure that has, in recent years, been perfected to a fine art and is capable of planarizing wafer surfaces to a high precision.

A photoresist layer 32 in which via openings 34 are defined is next formed over the silicon oxide layer 30 using conventional photolithographic procedures. The photoresist pattern 32 will be used to form a silicon oxide hardmask which is then used to etch vias in the subjacent organic layer 28. The utilization of a silicon oxide hardmask also permits the use of very thin photoresist layers (<0.8 microns thick) to pattern the hardmask, a requirement for the resolution of images of the order of 0.25 microns by DUV(deep ultraviolet) photolithography.

The wafer is loaded into the chamber of a single wafer dry etching tool capable of anisotropic plasma etching, for example, a high density plasma(HDP) parallel plate reactor. A suitable reactor is the model TCP-9100 manufactured by LAM Research Corporation. The reactor is of the parallel plate type and is fitted with an erodible plate, for example silicon or graphite bonded to a metal cathode. The etching tool provides the capability of controlling both the ion density(TCP) and the ion energy(BIAS) of the glow discharge.

The silicon oxide layer 30 is first patterned by RIE or anisotropic plasma etching to form a hardmask by using an etchant containing fluorocarbons, for example $CF_4$ or $CHF_3$. Anisotropic etching of silicon oxide is a well known procedure in the art. Since the photoresist is only required to endure the etching of the hardmask the resist layer may be of minimal thickness and therefore optimal for high resolution photolithography. The completion of the hardmask patterning is detected by using optical emission spectroscopy and sensing endpoint. After endpoint, the oxide etch is continued for a timed over-etch period of about 30%. This assures complete opening of the hardmask pattern.

The etchant gas is next changed to a mixture containing $O_2$ at a flow rate of between about 10 and 40 SCCM (standard cubic centimeters per minute) in a carrier gas of argon at a flow rate of between about 10 and 40 SCCM. Alternately a carrier gas of helium may be used. The flow rate of the carrier gas is adjusted to maintain a pressure of between about 1 and 10 mTorr in the reactor chamber. $CO_2$ in a argon or helium carrier gas has also been found effective for forming vias in organic polymer layers and may be alternatively be used for that purpose in this embodiment.

Figure 2C:
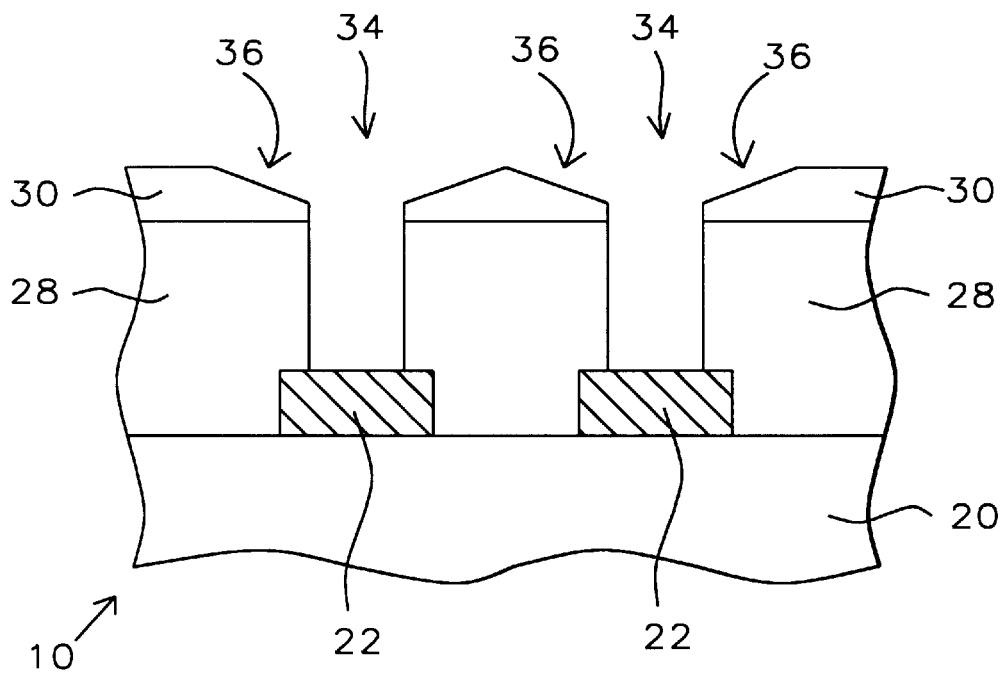

An rf discharge having a power of about 1,000 Watts TCP and about 1,500 Watts BIAS is struck in the etch chamber and the via openings 34 are etched in the organic polymer layer 28. Endpoint is determined by optical emission spectroscopy by observing the increase of a nitrogen containing peak, for example, CN. Again an over etch period of about 30% is allowed to assure complete removal of organic polymer at the base of the via openings 34 exposing the metal pattern 22. FIG. 2c shows a cross section of the via openings 34 after the IMD layer 28 etch. Any photoresist which remained after the silicon oxide hardmask patterning will also have been removed by the oxygen in the etchant, leaving only residual hardmask 30 exposed. It is important to assure that such residual photoresist has been removed.

After the via openings 34 have been formed, the residual oxide hardmask is non-uniform and exhibits an angular aspect or faceting 36 at the edges of the via openings 34. This behavior is believed to be brought about by argon sputtering of the hardmask under the etching conditions which are required to produce optimal sidewall profiles of the via openings 34. This causes, not only faceting at the via openings, but also a significant degradation of the hardmask planarity. If left in place the residual hardmask would cause the occurrence of via-to-via shorts after patterning the second metallization level. In order to avoid such severe yield detraction, the residual hardmask 30 must be selectively removed immediately after the vias have been formed, restoring the planarity of the wafer surface. This is accomplished by a soft isotropic plasma etch in a plasma containing $CF_4$. The plasma etching process is preferably conducted in the same tool as the via etch, eliminating any unnecessary wafer handling and time consuming transfers.

After the vias 34 have been etched in the organic layer 28, the etchant gas is changed to a mixture containing $CF_4$ at a flow rate of between about 30 and 60 SCCM in a carrier gas of argon at a flow rate of between about 100 and 200 SCCM. Alternately the etchant may include $SF_6$ or other fluorocarbons. The flow rate of the carrier gas is adjusted to maintain a pressure of between about 5 and 15 mTorr in the reactor chamber. An rf discharge having a power of between about 400 and 1,200 Watts TCP and between about 1,000 and 1,500 Watts BIAS is struck in the etch chamber. The etching parameters are optimized by conventional methods including, variations of pressure, flow rates, electrode spacings and the like to achieve a high oxide-to-organic layer selectivity which is important to the removal of all the hardmask material 30 without removing significant amounts of the subjacent organic dielectric layer 28. or causing damage to the conductive layer 22 exposed in the via openings 34. The oxide-to-organic layer selectivity should be greater than four and preferably greater than five- or six-to-one.

Figure 2D:
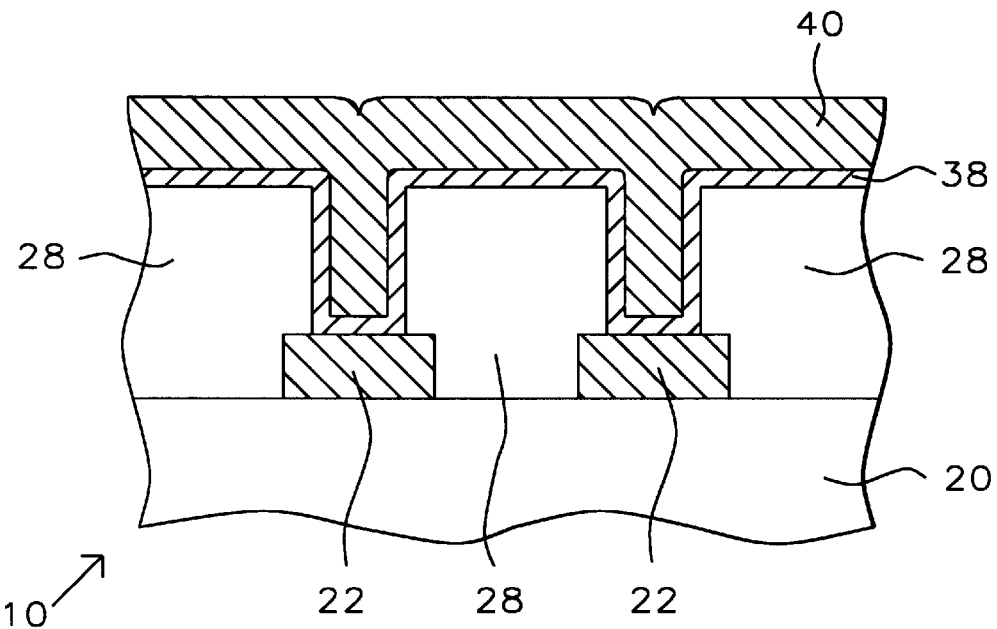

The wafer is next transferred to a sputter deposition tool for barrier metal deposition. Prior to the deposition of a barrier layer, the wafer is subjected to a period of argon sputtering which assures an clean oxide-free metallic surface onto which the barrier metal becomes bonded. Referring now to FIG. 2d, a Ti/TiN adhesion/barrier layer 38 is sputter deposited forming a lining in the via openings 34 immediately after and in the same pumpdown as the argon pre-sputtering. The formation of adhesion/barrier layers is well known.

The wafer is then removed from the sputtering tool and a tungsten layer 40 is deposited on the wafer using LPCVD, preferably by the silane reduction method using $SiH_4$ and $WF_6$. This deposition method is well known to those in the art and permits the deposition of W at temperatures between about 240° C. and 280° C. The tungsten layer 40 fills in the via openings 34 and blankets the entire wafer.

Figure 2E:
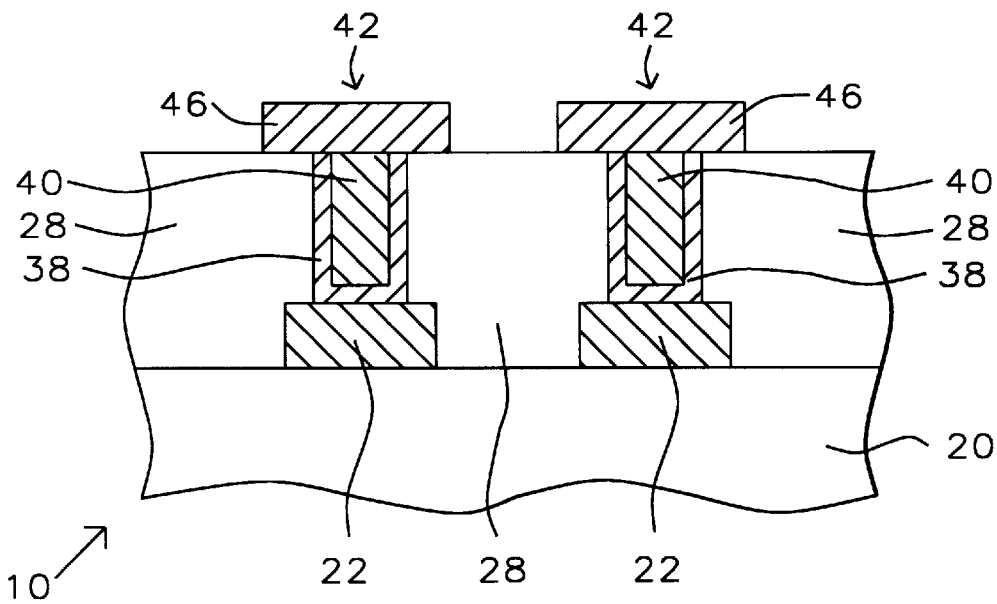

Referring to FIG. 2e, the tungsten layer 40 and the adhesion/barrier layer 38 are polished back to the IMD layer 28 surface by CMP thereby forming isolated vias 42. An alternate method for example RIE etchback, may be used to anisotropically remove the tungsten layer 40 and the adhesion/barrier layer 38 to the surface of the IMD layer 28. A second level of conductive wiring 46 is then patterned on the IMD layer 28.

The embodiments use silicon wafers. It should be well understood by those skilled in the art that other semiconductor substrates may also be used and, by applying the procedures taught by this invention, the same objectives may be achieved. While the invention has been particularly shown and described with reference to the preferred embodiments thereof, it will be understood by those skilled in the art that various changes in form and details may be made without departing from the spirit and scope of the invention.

Although the embodiments are applied to poly(arylene ether) dielectric layers other low-k organic polymer materials are also contemplated by this invention. In addition other deposition methods for such low-k organic materials such as vapor deposition may be used without departing from the spirit and scope of the invention.

What is claimed is:

1. A method for forming a via on a semiconductor wafer comprising:

(a) providing a semiconductor wafer having a first conductive layer;

(b) patterning said first conductive layer;

(c) forming a organic polymer layer on said wafer;

(d) planarizing said organic polymer layer;

(e) forming a hardmask over said organic polymer layer;

(f) anisotropically etching said organic polymer layer, thereby forming an opening in said organic polymer layer exposing a region of said first conductive layer;

(g) removing said hardmask after said anisotropic etching;

(h) depositing a second conductive layer over said wafer after said hardmask has been removed; and (i) selectively removing planar portions of said second conductive layer and leaving a plug of said second conductive layer in said opening, said plug comprising a conductive via.

2. The method of claim 1 wherein said organic polymer layer is taken from the group consisting of a poly(arylene ether) and a polyimide.

3. The method of claim 1 wherein said hardmask comprises silicon oxide.

4. The method of claim 1 wherein said anisotropic etching is accomplished in a parallel plate HDP reactor.

5. The method of claim 1 wherein said hardmask is removed by isotropic plasma etching in an etchant containing fluorocarbons.

6. The method of claim 5 wherein said isotropic plasma etching is accomplished in a parallel plate HDP reactor in-situ and sequential to said anisotropic etching.

7. The method of claim 6 wherein said isotropic plasma etching is accomplished in a plasma containing $CF_4$ at a flow rate of between about 30 and 60 SCCM, in an argon carrier gas at a flow rate sufficient to maintain a pressure of between about 5 and 15 mTorr in said HDP reactor and at an rf power of between about 400 and 1,200 Watts TCP and between about 1,000 and 1,500 Watts BIAS.

8. The method of claim 6 wherein said plasma etching is accomplished in a plasma containing $SF_6$ at a flow rate of between about 30 and 60 SCCM, in an argon carrier gas at a flow rate sufficient to maintain a pressure of between about 5 and 15 mTorr in said HDP reactor and at an rf power of between about 400 and 1,200 Watts TCP and between about 1,000 and 1,500 Watts BIAS.

9. The method of claim 1 wherein said second conductive layer is tungsten.

10. The method of claim 1 wherein said planar portions of said second conductive layer are removed by CMP.

11. The method of claim 1 wherein said planar portions of said second conductive layer are removed by RIE.

* * * * *